(12) United States Patent
Kim et al.

(10) Patent No.: US 7,897,430 B2
(45) Date of Patent: Mar. 1, 2011

(54) ORGANIC THIN FILM TRANSISTORS INCLUDING METAL OXIDE NANOPARTICLES WITHIN A PHOTOCURABLE TRANSPARENT POLYMER GATE INSULATOR LAYER AND METHOD FOR FABRICATING THE SAME BY USING SOL-GEL AND PHOTOCURING REACTIONS

(75) Inventors: Jai Kyeong Kim, Seoul (KR); Dong Young Kim, Seoul (KR); June Whan Choi, Seoul (KR); Ho Gyu Yoon, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 58 days.

(21) Appl. No.: 12/361,000

(22) Filed: Jan. 28, 2009

(65) Prior Publication Data

US 2009/0224234 A1 Sep. 10, 2009

(30) Foreign Application Priority Data

Jan. 29, 2008 (KR) .................. 10-2008-0008816

(51) Int. Cl.
*H01L 51/40* (2006.01)
(52) U.S. Cl. .................. 438/99; 438/158; 438/216; 438/287; 257/40; 257/E51.005; 257/E51.006; 257/E51.007
(58) Field of Classification Search .............. None
See application file for complete search history.

(56) References Cited

U.S. PATENT DOCUMENTS 6,559,070 B1 5/2003 Mandal

2006/0273302 A1* 12/2006 Birau et al. .................. 257/40
2008/0001150 A1* 1/2008 Chae et al. .................. 257/59

FOREIGN PATENT DOCUMENTS

| KR | 10-0726523 | 11/2001 |
|---|---|---|
| KR | 10-20050071539 A | 7/2005 |
| KR | 10-2008-0002544 A | 1/2008 |
| KR | 10-20080030454 A | 4/2008 |
| WO | WO 2004/031860 A2 | 4/2004 |

OTHER PUBLICATIONS

Korean Intellectual Property Office, Office Action in KR 10-2008-0008816, Jan. 4, 2010.

(Continued)

*Primary Examiner*—Matthew S Smith
*Assistant Examiner*—Shaka Scarlett
(74) *Attorney, Agent, or Firm*—Jones Day

(57) ABSTRACT

The present invention relates to an organic thin film transistor comprising a photocurable transparent inorganic/polymer composite layer as a gate insulator layer in which metal oxide nanoparticles are generated within a photocurable transparent polymer through sol-gel and photocuring reactions and whose permittivity is easily regulated; and a fabrication method thereof. Since the organic thin film transistor according to the present invention utilizes the photocurable transparent inorganic/polymer composite layer showing a significantly high and readily controllable permittivity as a gate insulator, it is capable of operating under low voltage conditions and has a high on/off current ratio due to low leakage current. Further, the organic thin film transistor according to the present invention preserves the unique properties of the photocurable transparent polymer, enabling the formation of a photocurable micropattern of a gate insulator having high processibility.

21 Claims, 5 Drawing Sheets
(3 of 5 Drawing Sheet(s) Filed in Color)

OTHER PUBLICATIONS

H. Shirakawa, et al., "Synthesis of Electrically Conducting Organic Polymers: Halogen Derivatives of Polyacetylene, $(CH)_x$," 1977, J.C. S. Chem Comm. 578, Heffers Printers Ltd., Cambridge, England.

Korean Notice of Allowance dated May 31, 2010.

* cited by examiner

ORGANIC THIN FILM TRANSISTORS INCLUDING METAL OXIDE NANOPARTICLES WITHIN A PHOTOCURABLE TRANSPARENT POLYMER GATE INSULATOR LAYER AND METHOD FOR FABRICATING THE SAME BY USING SOL-GEL AND PHOTOCURING REACTIONS

The present application claims priority from Korean Patent Application No. 10-2008-8816 filed Jan. 29, 2008, the subject matter of which is incorporated herein by reference.

FIELD OF THE INVENTION

The present invention relates to organic thin film transistors using a photocurable transparent inorganic/organic composite layer as a gate insulator layer in which metal oxide nanoparticles are generated within a photocurable transparent polymer through sol-gel and photocuring reactions and whose permittivity can be easily regulated; and a method for the fabrication thereof.

BACKGROUND OF THE INVENTION

Since a study on conductive polymers was reported for the first time in 1977 (H. Shirakawa et al., Chem. Commun. 578, 1977), research on identifying the conductive or semi-conductive features of organic materials and polymers, in addition to their previously verified insulator properties, has been actively carried out.

As shown in FIG. 1, organic thin film transistors, one of such organic electronic device fields, function as the driving circuit of an organic device, such as a display, based on the principle that, when a voltage is applied to a gate electrode, electric charges are accumulated due to a local polarization effect caused by the dielectric properties of a gate insulator layer, and the thus accumulated electric charges forms a channel between the gate insulator layer and an organic activation layer. While when a voltage is applied to the region between the source and the drain, a driving state ("on" state) where the electric charges flow is made, when a reverse voltage (0 voltage) is applied thereto, a non-driving state ("off" state) where the electric charges do not flow is made even though a voltage is applied to the region between them.

Further, since organic thin film transistors utilize low molecular organic materials or polymers as a structural component unlike conventional silicon-based transistors, they have the advantage that they can be applied to various fields of flexible organic devices such as flexible displays of the next generation.

In such an organic thin film transistor, the dielectric properties of a gate insulator layer play an important role in the device performance. By controlling such dielectric properties, the local polarization effect is maximized, enabling an increase in the accumulation of dielectric charges under low voltage conditions, resulting in low voltage operation. Further, when a gate insulator layer with high permittivity is used, the thickness of a gate insulator layer can be increased without the lowering of capacitance, and a high output current can be stably maintained while preventing the generation of a leakage current, which is a chronic problem of organic devices, thereby making it favorable for the commercialization of organic thin film transistor as a driving semiconductor.

However, as compared with the conventional silicon-based transistors, organic thin film transistors show relatively low charge carrier mobility and have a low on/off current ratio where their current at the on state is low, while their current at the off state is high. This is because it is difficult to fabricate a gate insulator layer with a high permittivity by using organic polymers. Consequently, high dielectric inorganic materials are used as the gate insulator, where the biggest advantage of organic thin film transistors, i.e., flexibility, must be sacrificed.

SUMMARY OF THE INVENTION

The present invention is directed to overcoming the above deficiencies in the art. One of the objectives of the present invention is to provide an organic thin film transistor using a photocurable transparent inorganic/polymer composite layer as a gate insulator layer, which is capable of operating under low voltage conditions, has a high on/off current ratio due to low leakage current and is capable of forming a micropattern of a gate insulator, where the photocurable transparent inorganic/polymer composite layer is formed by generating and combining metal oxide nanoparticles within a photocurable transparent polymer and its permittivity is easily regulated; and a fabrication method thereof.

Another objective of the present invention is to provide various methods of regulating the size and concentration of metal oxide nanoparticles within the photocurable transparent polymers and regulating the permittivity of the gate insulator.

In order to achieve the above objectives, one embodiment of the present invention relates to an organic thin film transistor comprising a substrate, a gate electrode layer formed on the substrate, a photocurable transparent inorganic/polymer composite layer including metal oxide nanoparticles formed on the substrate and gate electrode, an organic activation layer and a source-drain electrode layer, where the photocurable transparent inorganic/polymer composite layer including metal oxide nanoparticles is formed to exhibit dielectric properties by mixing a metal oxide precursor and a photocurable transparent polymer, coating the mixture on the substrate and gate electrode by spin-casting to form an organic film, and converting a part of the organic film into nano-inorganic particles through sol-gel and photocuring reactions.

Another embodiment of the present invention relates to a method of fabricating an organic thin film transistor which comprises the following steps:

1) forming a gate electrode on a substrate;

2) forming a photocurable transparent inorganic/polymer composite layer including metal oxide nanoparticles on the above substrate and gate electrode;

3) forming an organic activation layer on the above photocurable transparent inorganic/polymer composite layer; and 4) forming a source-drain electrode layer on the organic activation layer, where step 2) is carried out by mixing a metal oxide precursor, a reaction regulator, a catalyst and a photocurable polymer, coating the mixture on the substrate and gate electrode, and performing sol-gel and photocuring reactions.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

The embodiments of the present invention will be described in detail with reference to the following drawings.

10: glass substrate; 20: gate electrode layer; 30: photocurable transparent inorganic/polymer composite layer including metal oxide nanoparticles; 40: organic activation layer; 50: source electrode layer; 60: drain electrode layer.

Figure 2:
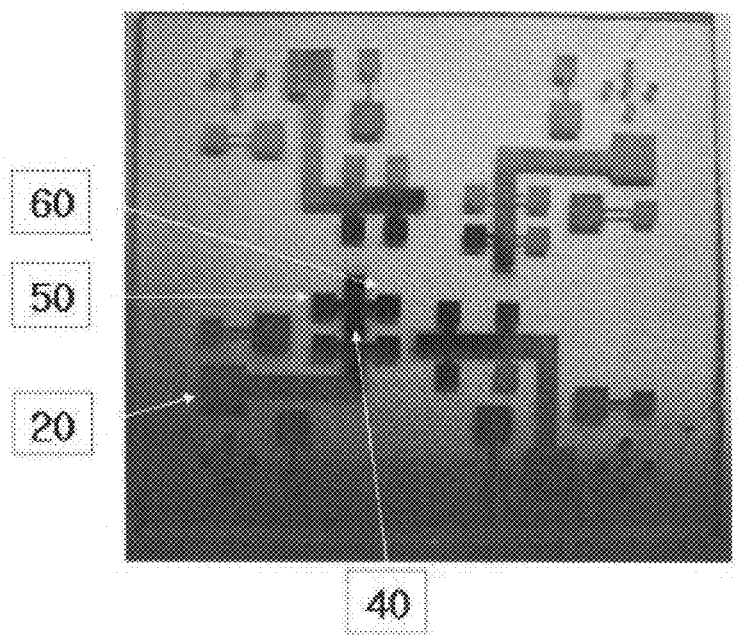

FIG. 2 is an actual model of an organic thin film transistor fabricated in Example 1 of the present application.

20: gate electrode layer; 40: organic activation layer; 50: source electrode layer; 60: drain electrode layer.

Figure 3:
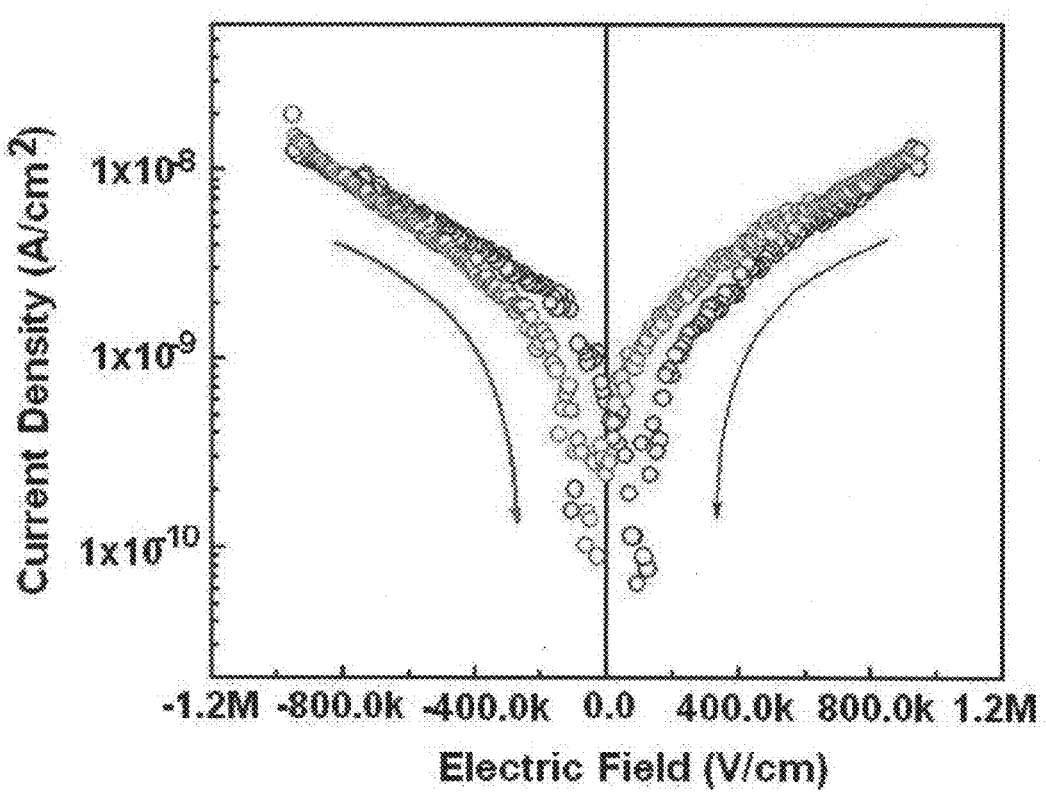

FIG. 3 is a graph illustrating the change in permittivity according to the increase in nano-inorganic particle content in a photocurable transparent inorganic/polymer composite layer including metal oxide nanoparticles fabricated in Example 1 of the present application.

30: photocurable transparent inorganic/polymer composite layer including metal oxide nanoparticles; 70: photocurable polymer.

Figure 4:
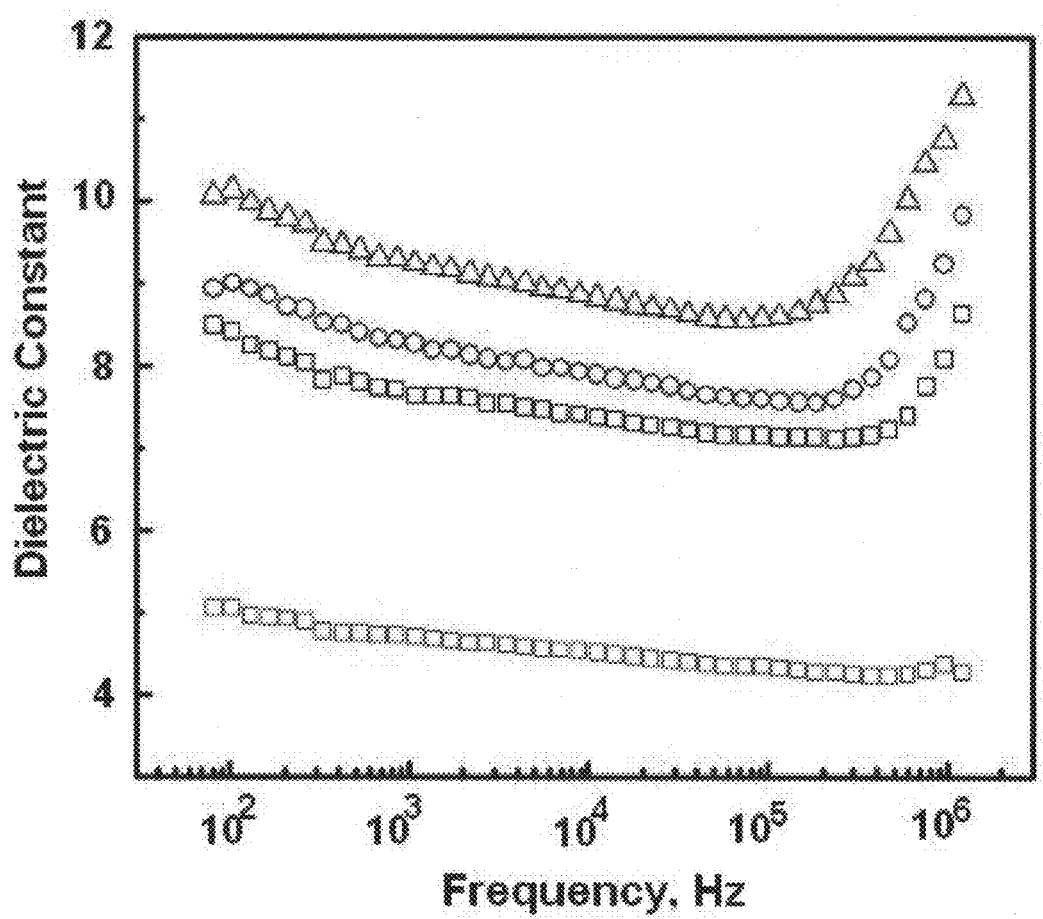

FIG. 4 is a graph showing the leakage current density according to the electric field applied to a photocurable transparent inorganic/polymer composite layer including metal oxide nanoparticles fabricated in Example 1 of the present application.

Figure 5:
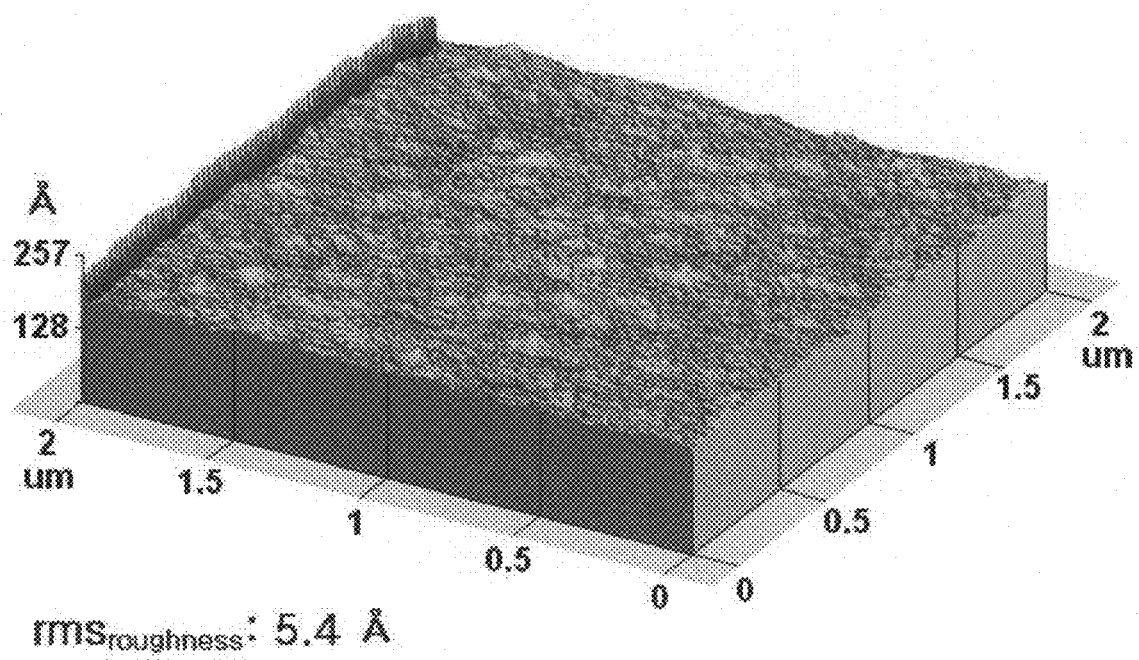

FIG. 5 is an atomic force microscopy (AFM) photograph visualizing the surface morphology and roughness of a photocurable transparent inorganic/polymer composite layer including metal oxide nanoparticles fabricated in Example 1 of the present application.

Figure 6:
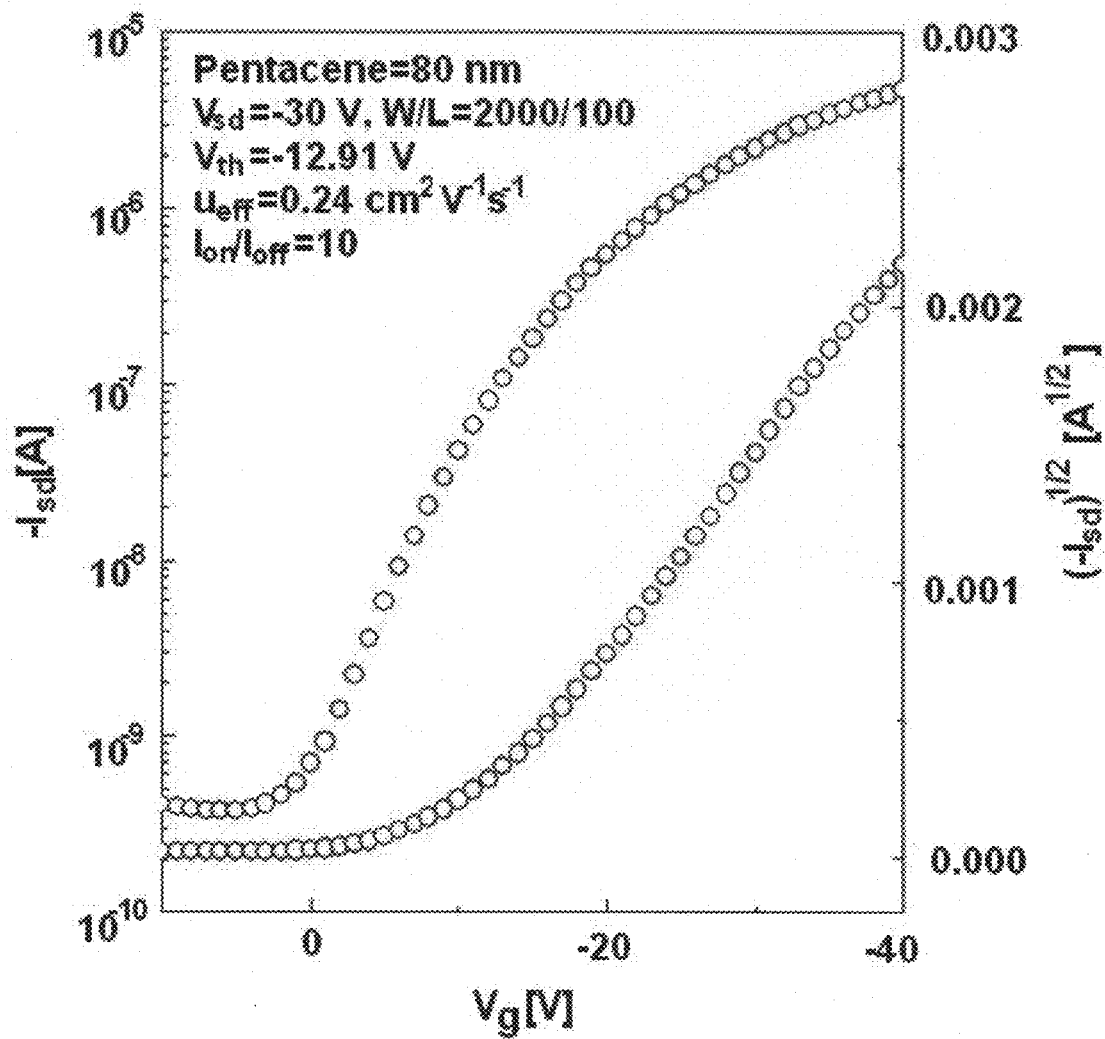

FIG. 6 is a graph illustrating the current transfer characteristics of an organic thin film transistor fabricated in Example 1 of the present application.

DETAILED DESCRIPTION OF THE INVENTION

The present invention provides an organic thin film transistor comprising a substrate, a gate electrode layer formed on the substrate, a photocurable transparent inorganic/polymer composite layer including metal oxide nanoparticles formed on the substrate and gate electrode, an organic activation layer and a source-drain electrode layer, where the photocurable transparent inorganic/polymer composite layer including metal oxide nanoparticles is prepared to exhibit dielectric properties by mixing a metal oxide precursor and a photocurable transparent polymer, coating the mixture on the substrate and gate electrode by spin-casting to form an organic film, and converting a part of the organic film into nano-inorganic particles through sol-gel and photocuring reactions.

For simple comparisons with conventional technology, the present application describes titanium oxide as a metal oxide nanoparticle by way of example, but compounds such as, but not limited to, zinc oxide, tin oxide, niobium oxide, tungsten oxide, strontium oxide, zirconium oxide and mixtures thereof may also be used, in addition to titanium oxide.

Further, the present invention utilizes spin-coating as a coating method to form a photocurable transparent inorganic/polymer composite layer including metal oxide nanoparticles in one embodiment, but the scope of the present invention is not limited thereto. Thus, various methods for forming a layer on a substrate, such as screen printing, bar coating, ink jetting, dipping, and the like, may be used.

Hereinafter, the organic thin layer transistor according to the present invention will be explained in more detail with reference to the accompanying drawings.

Figure 1:
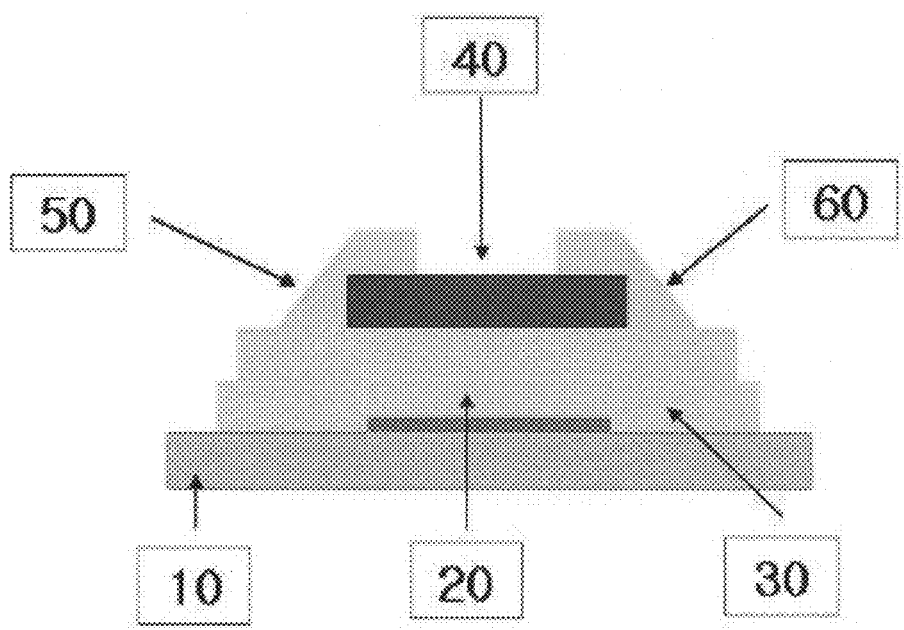
FIG. 1 is a schematic diagram illustrating an organic thin film transistor according to the present invention.

Referring to FIG. 1, in one embodiment of the present invention, the organic thin layer transistor includes a substrate 10, a gate electrode 20, a gate insulator layer 30, an organic activation layer 40, and source-drain electrodes 50, 60.

The substrate 10 and gate electrode 20 may be in the form of a glass substrate or a transparent flexible polymer substrate on which a metal electrode is deposited. Here, suitable examples of the transparent flexible substrate may include polyethylene terephthalate (PET), polymethyl methacrylate (PMMA), polycarbonate (PC), polyethylene sulfone (PES) and the like. The electrode may be made of a metal selected from the group consisting of gold (Au), silver (Ag), chrome (Cr), cobalt (Co), copper (Cu), nickel (Ni), zinc (Zn), molybdenum (Mo), aluminum (Al), titanium (Ti), and any mixtures or alloys thereof.

The substrate 10 and gate electrode 20 may be a transparent conductive substrate, which may be in the form of a transparent glass substrate or a transparent flexible polymer substrate coated with a conductive thin film. Here, suitable examples of the transparent flexible substrate may include polyethylene terephthalate (PET), polymethyl methacrylate (PMMA), polycarbonate (PC), polyethylene sulfone (PES) and the like, while suitable examples of the conductive thin film may include a thin film coated with ITO (indium tin oxide), IZO (indium zinc oxide), IZTO (indium zinc tin oxide), FTO (F-doped $SnO_2$), ITO/ATO (antimony tin oxide), ITO/FTO and the like.

The gate insulator layer 30 is a photocurable transparent inorganic/polymer composite layer including metal oxide nanoparticles, in which the metal oxide nanoparticles may be formed by mixing a metal oxide precursor, a reaction regulator, a catalyst and a photocurable polymer, coating the mixture on the substrate, and performing sol-gel and photocuring reactions.

In another embodiment of the present invention, the density of the photocurable transparent inorganic/polymer composite layer defined as the weight ratio of metal oxide nanoparticles per unit volume of the photocurable transparent inorganic/polymer composite layer including metal oxide nanoparticles 30 may be in the range from 0.9 to 3.0 g/cm$^3$. If the density of the photocurable transparent inorganic/polymer composite layer is not more than 0.9 g/cm$^3$, no metal oxide nanoparticles are formed and it may be problematic in that the composite layer shows permittivity identical to that of the photocurable transparent polymer used as a base polymer. If the density of the photocurable transparent inorganic/polymer composite layer exceeds 3.0 g/cm$^3$, an excessive amount of metal oxide nanoparticles is formed where there are problems with precipitation and coagulation, resulting in decreased uniformity and transparency.

The desired density of the photocurable transparent inorganic/polymer composite layer can be achieved by 1) regulating the content ratio of the metal oxide precursor and photocurable polymer in the mixture; 2) regulating the reaction rate by varying the content ratio of the reaction regulator and catalyst; 3) regulating the reaction temperatures of the sol-gel and photocuring reactions; or 4) a combination of at least two of the methods 1) to 3).

The metal oxide nanoparticle included in the photocurable transparent inorganic/polymer composite layer is in a single crystal form and has an average particle size ranging from 5 to 50 nm. If the particle size is below the above range, the metal oxide nanoparticles do not exhibit the desired dielectric properties, whereas if the particle size exceeds the above range, there are problems with the composite layer forming unevenly, thereby generating excessive leakage current or the composite layer becoming opaque. Further, the photocurable transparent inorganic/polymer composite layer including metal oxide nanoparticles may have a thickness ranging from 400 to 2000 nm. If the thickness is below the above range, excessive leakage current is generated, whereas if the thickness exceeds the above range, the capacitance is reduced. The fabrication of the photocurable transparent inorganic/polymer composite layer including metal oxide nanoparticles will be explained in more detail later.

The organic activation layer 40 may be made of a low molecular organic semi-conductive material or a polymer semi-conductive material, such as pentacene, oligothiophene, regioregular poly(3-alkylthiophene), poly(3-hexylthiophene), and the like.

The source-drain electrodes 50, 60 may be made of a metal selected from the group consisting of gold (Au), silver (Ag), lithium fluoride (LiF), chrome (Cr), cobalt (Co), copper (Cu), nickel (Ni), zinc (Zn), molybdenum (Mo), aluminum (Al), titanium (Ti), and any mixtures or alloys thereof.

In another embodiment of the present invention, a photocurable transparent inorganic/polymer composite layer including metal oxide nanoparticles, in which titanium oxide is utilized as a metal oxide nanoparticle and a photocurable acrylic polymer is utilized as a photocurable transparent polymer, is fabricated as a gate insulator layer.

The permittivity and leakage current of the photocurable transparent inorganic/polymer composite layer according to the present invention may be regulated and controlled by various methods as described below.

First, the permittivity of the composite layer may be controlled by regulating the content ratio of the metal oxide precursor and photocurable transparent polymer in the coating solution. If the content of the photocurable transparent polymer is high, the content of metal oxide nanoparticles obtained after sol-gel and photocuring reactions decreases, leading to a reduction in the permittivity of the photocurable transparent inorganic/polymer composite layer. On the other hand, if the content of the photocurable transparent polymer is low, the content of metal oxide nanoparticles obtained after sol-gel and photocuring reactions increases, leading to an increase in permittivity of the photocurable transparent inorganic/polymer composite layer.

Secondly, unlike permittivity, regulating and controlling the leakage current of the composite layer is complicated. If the content of the metal oxide precursor decreases while the content of the photocurable transparent polymer increases, the leakage current is reduced, but such conditions significantly affect the particle size and distribution of metal oxide nanoparticles obtained after the sol-gel and photocuring reactions. Therefore, it is not desirable to totally reduce the content of the metal oxide precursor in order to reduce the generation of leakage current. Thus, in the present invention, the content ratio of the metal oxide precursor to the photocurable transparent polymer is maintained in the range from 10:0.5 to 10:4.

Further, the present invention provides a method of fabricating the above organic thin film transistor.

The fabrication method of the organic thin film transistor according to the present invention may comprises the following steps:

1) forming a gate electrode on a substrate;

2) forming a photocurable transparent inorganic/polymer composite layer including metal oxide nanoparticles on the above substrate and gate electrode;

3) forming an organic activation layer on the above photocurable transparent inorganic/polymer composite layer; and 4) forming a source-drain electrode layer on the above organic activation, where step 2) is carried out by mixing a metal oxide precursor, a reaction regulator, a catalyst and a photocurable polymer, coating the mixture on the substrate and gate electrode, and performing sol-gel and photocuring reactions.

Here, since, except for the step of forming a photocurable transparent inorganic/polymer composite layer including metal oxide nanoparticles, the other steps may be carried out by conventional techniques known in the art, hereinafter, the step of forming a photocurable transparent inorganic/polymer composite layer including metal oxide nanoparticles, which is the distinctive characteristic of the present invention, will be explained in further detail.

Specifically, the step of forming a photocurable transparent inorganic/polymer composite layer including metal oxide nanoparticles may comprise the following steps:

a) mixing a metal oxide precursor and a reaction regulator to substitute an alkoxide group of the metal oxide precursor;

b) adding a catalyst and a photocurable transparent polymer to the above mixture;

c) coating the above resulting mixture on a substrate and a gate electrode formed on the substrate and carrying out a sol-gel reaction; and d) carrying out a photocuring reaction of the sol-gel-layer coated on the above substrate using a pattern mask and developing the same.

In order to form the above photocurable transparent inorganic/polymer composite layer including metal oxide nanoparticles, the metal oxide precursor is mixed first with a suitable amount of the reaction regulator. This is to regulate the reaction rate by replacing the alkoxide group of the metal oxide precursors and prevent the metal oxide precursor from precipitating before the sol-gel reaction.

Suitable examples of a metal oxide precursor for the present invention may include titanium (Ti) alkoxides, zinc (Zn) alkoxides, tin (Sn) alkoxides, niobium (Nb) alkoxides, tungsten (W) alkoxides, strontium (Sr) alkoxides, zirconium (Zr) alkoxides and the like. When the above metal oxide precursor is mixed with a photocurable transparent polymer, coated on a substrate, and subjected to a sol-gel reaction, metal oxides, such as titanium oxide, zinc oxide, tin oxide, niobium oxide, tungsten oxide, strontium oxide and zirconium oxide, may be formed.

Suitable examples of a reaction regulator for the present invention may include acetic acid, acetylacetone (acac) and the like, but any type of chelating agent may be used, as long as it can substitute the alkoxide group of the metal oxide precursor.

The molar ratio of the reaction regulator to the above metal oxide precursor may be in the range from 1:0.5 to 1:1.5. If the molar ratio is below the above range, it may be problematic in that it may be difficult to control the reaction rate due to the insufficient substitution of the reaction regulator with the alkoxide group of the metal oxide precursor. If the molar ratio exceeds the above range, there may be a problem due to the surplus reaction regulator acting as impurities.

Next, a coating solution is prepared by adding a catalyst and a photocurable polymer to the mixture of the metal oxide precursor and reaction regulator and mixing them. If the metal oxide precursor is highly reactive, it may be desirable to add the photocurable polymer to the mixture first, stabilize it, and then add the catalyst thereto.

Suitable examples of a photocurable transparent polymer for the present invention may include unsaturated polyester polymers, acrylic polymers, epoxy polymers, polyvinylalcohol polymers and the like.

Further, suitable examples of a catalyst for the present invention may include hydrochloric acid, sulfuric acid, nitric acid, sodium hydroxide, potassium hydroxide, ammonia and the like. In one embodiment, the catalyst is added in a concentration of 0.01 to 0.5 N.

In another embodiment, the mass ratio of the catalyst to the reaction regulator is in the range from 1:0.1 to 1:1. If the mass ratio is below or above that range, there may be problems with the subsequent sol-gel and photocuring reactions not taking place or formation of a non-uniform composite layer due to surplus catalysts. Further, in another embodiment, the mass ratio of the metal oxide precursor to the above photocurable transparent polymer is in the range from 1:0.01 to 1:0.5. If the mass ratio is below that range, not enough metal oxide nanoparticles are generated, which makes it difficult to form a composite layer having high permittivity. If the mass ratio is above that range, metal oxide nanoparticles are generated excessively, leading to the formation of a non-uniform and opaque composite layer.

The resulting mixture of the metal oxide precursor, reaction regulator, catalyst and photocurable transparent polymer prepared above is coated on a substrate and a gate electrode formed on such substrate and subjected to a sol-gel reaction at an appropriate temperature. After the reaction is completed, the sol-gel layer coated on the substrate and gate electrode is subjected to a photocuring reaction at a light intensity with a suitable wavelength using a pattern mask and then developed, thereby forming a photocurable transparent inorganic/polymer composite layer containing patterned metal oxide nanoparticles.

In another embodiment, the sol-gel reaction in the above step is carried out at a temperature of 80 to 150° C. for a period of 1 to 300 minutes. If the reaction temperature is not more than 80° C. or exceeds 150° C., the sol-gel reaction does not occur or the photocuring reaction occurs before the sol-gel reaction, which makes it impossible for the metal oxide nanoparticles to be formed.

Further, in another embodiment, the photocuring reaction is conducted at a wavelength of 200 to 400 nm with a dose of 100 to 400 mJ. If the photocuring wavelength and dose deviate from the above range, the photocuring reaction does not occur, and thus, no composite layer is formed.

In another embodiment, the thus generated metal oxide nanoparticle is in a single crystal form and has an average particle size ranging from 5 to 20 nm. Further, in another embodiment, the photocurable transparent inorganic/polymer composite layer including the metal oxide nanoparticles has a thickness ranging from 400 to 2000 nm, a density ranging from 0.9 to 3.0 g/cm, and a dielectric constant ranging from 4 to 15.

As described above, since the organic thin film transistor according to the present invention utilizes as a gate insulator the photocurable transparent inorganic/polymer composite layer including metal oxide nanoparticles which exhibits significantly higher and readily controllable permittivity compared to the conventional gate electrode, it is capable of improving the on/off current ratio while reducing the driving voltage, is able to minimize the leakage current by increasing the thickness of the gate insulator without a reduction in capacitance, and thereby shows excellent properties as an organic thin film transistor. Further, the organic thin film transistor according to the present invention preserves the unique properties of the photocurable transparent polymer, enabling the formation of a photocurable micropattern having high processability.

EXAMPLES

Hereinafter, the embodiments of the present invention will be described in more detail with reference to the following Examples. However, the Examples are only provided for purposes of illustration and are not to be construed as limiting the scope of the invention.

In the following Examples, an organic thin film transistor using a gate insulator which is prepared by generating titanium oxide nanoparticles within a photocurable transparent polymer through sol-gel and photocuring reactions and whose permittivity can be easily regulated is fabricated according to the methods described above.

Example 1

0.8 g of titanium n-butoxide (Aldrich) and 0.235 g of acetylacetone (Aldrich) were mixed at room temperature by stirring with a magnetic bar for 1 hour. 8.454 g of UV-cured acrylic resin (Dongjin Semichem Co., Ltd) was successively added thereto and mixed for 2 hours by stirring. To the resulting mixture was added 0.08247 g of 0.1 N HCl (Junsei), which was dispersed by stirring and ultrasonication for 1 hour, to obtain a coating solution. The coating solution was subjected to spin-casting for 30 seconds at a rate of 200 rpm on a glass substrate in which gold (Au) was deposited as a gate electrode in a thickness of 200 nm, to thereby form a transparent organic film. The glass substrate on which the above transparent organic film was formed was subjected to a sol-gel reaction by heating it in an oven at 100° C. for 20 minutes. After the sol-gel reaction was completed, the glass substrate was photocured by using a UV lamp (365 nm) at a dose of 300 mJ, followed by post-curing at 120° C. for 30 minutes, to thereby form a gate insulator. On the gate insulator, pentacene was deposited as an organic activation layer in a thickness of 80 nm, and then source-drain electrodes were deposited on the above organic activation layer by using gold (Au), to thereby fabricate an organic thin film transistor.

The electrical properties of the organic thin film transistor fabricated above were examined as follows. First, in order to examine the change in permittivity according to the increase in nanoparticle content in the photocurable transparent inorganic/polymer composite layer formed in the organic thin film transistor, the dielectric constant was measured where the amount of the metal oxide precursor was varied while the amount of the photocurable transparent polymer was fixed. The results are shown in FIG. 3.

Further, in order to measure the leakage current of the photocurable transparent inorganic/polymer composite layer, a metal-insulator-metal (MIM) method was carried out. Specifically, after an ITO layer coated on a glass substrate was patternized in a regular size, the photocurable transparent inorganic/polymer composite layer according to the present invention was coated thereon as described above. On the above composite layer, a gold (Au) layer was deposited in the same size so as to allow each of the ITO and gold layers to function as an electrode. Subsequently, an electric field was applied between the two layers, and then the current density was measured to calculate the leakage current flowing in the resistance layer. The results for the measurement of the leakage current according to the MIM method are shown in FIG. 4.

The surface morphology and roughness of the photocurable transparent inorganic/polymer composite layer according to the present invention were observed with an atomic force microscope (AFM), where the results are shown in FIG. 5. The current transfer characteristics of the organic thin film transistor including the photocurable transparent inorganic/polymer composite layer according to the present invention were examined according to the 1620™ IEEE Standard Test Methods for the Characterization of Organic Transistors and Materials (IEEE Std 1620™-2004), where the results are shown in FIG. 6.

According to the results shown in FIGS. 3 to 6, the photocurable transparent inorganic/polymer composite layer 30 including metal oxide nanoparticles according to the present invention was found to generate a low leakage current, exhibit a higher permittivity than the photocurable transparent polymer 70 used as a base polymer, can easily regulate the permittivity depending on the extent of formation of metal oxide nanoparticles, and show uniform surface roughness. Therefore, the photocurable transparent inorganic/polymer composite layer of the present invention has excellent current transfer characteristics capable of being operated as an organic thin film transistor. These results confirm that the photocurable transparent inorganic/polymer composite layer including metal oxide nanoparticles according to the present invention is a useful composition as a gate insulator of the organic thin film transistor, and that the method of fabricating an organic thin film transistor using such composition is very effective.

Example 2

An organic thin film transistor was fabricated by etching an ITO glass substrate and using it as a gate electrode according to the same conditions as described in Example 1.

Example 3

An organic thin film transistor was fabricated according to the same conditions as described in Example 1, except that a PES substrate was used instead of a glass substrate.

Example 4

0.8 g of titanium n-butoxide (Aldrich) and 0.282 g of acetylacetone (Aldrich) were mixed at room temperature by stirring with a magnetic bar for 1 hour. 10.125 g of UV-cured acrylic resin (Dongjin Semichem Co., Ltd) was successively added thereto and mixed by stirring for 2 hours. To the resulting mixture was added 0.09896 g of 0.1 N HCl (Junsei), which was dispersed by stirring and ultrasonication for 1 hour, to obtain a coating solution. The above coating solution was subjected to spin-casting at a rate of 200 rpm for 30 seconds on a glass substrate in which molybdenum (Mo) was deposited as a gate electrode in a thickness of 200 nm, to thereby form a transparent organic film. The glass substrate on which the transparent organic film was formed was subjected to a sol-gel reaction by heating it in an oven at 100° C. for 20 minutes. After the sol-gel reaction was completed, the glass substrate was photocured by using a UV lamp (365 nm) at a dose of 300 mJ, followed by post-curing at 120° C. for 30 minutes, to thereby form a gate insulator. On the above gate insulator, pentacene was deposited in a thickness of 80 nm as an organic activation layer, and then source-drain electrodes were deposited on the organic activation layer by using gold (Au), to thereby fabricate an organic thin film transistor.

While the present invention has been described and illustrated with respect to a number of embodiments of the invention, it will be apparent to those skilled in the art that variations and modifications are possible without deviating from the broad principles and teachings of the present invention, which should be limited solely by the scope of the claims appended hereto.

What is claimed is:

1. A method of fabricating, an organic thin film transistor, the transistor comprising a substrate, a gate electrode layer formed on said substrate, a photocurable transparent inorganic/polymer composite layer including metal oxide nanoparticles formed on said substrate and gate electrode, an organic activation layer formed on said composite layer and a source-drain electrode layer formed on said activation layer, wherein the photocurable transparent inorganic/polymer composite layer including metal oxide nanoparticles is prepared to exhibit dielectric properties by mixing a metal oxide precursor and a photocurable transparent polymer, coating the mixture on the substrate and gate electrode to form an organic film, and converting a part of the organic film into nano-inorganic particles through sol-gel and photocuring reactions, the method comprising the following steps:
1) forming a gate electrode on a substrate;
2) forming a photocurable transparent inorganic/polymer composite layer including metal oxide nanoparticles on said substrate and said gate electrode;
3) forming an organic activation layer on said photocurable transparent inorganic/polymer composite layer; and
4) forming a source-drain electrode layer on said organic activation layer, wherein step 2) is carried out by mixing a metal oxide precursor, a reaction regulator, a catalyst and a photocurable polymer, coating the mixture on the substrate and gate electrode, and performing sol-gel and photocuring reactions.

2. The method according to claim 1, wherein the photocurable transparent inorganic/polymer composite layer including metal oxide nanoparticles in step 2) is formed by the following steps:
a) mixing a metal oxide precursor and a reaction regulator to substitute an alkoxide group of said metal oxide precursor;
b) adding a catalyst and a photocurable transparent polymer to said mixture;
c) coating the resulting mixture on a substrate and a gate electrode formed on said substrate and performing a sol-gel reaction of said coating layer; and
d) carrying out a photocuring reaction of said sol-gel layer coated on the substrate using a pattern mask and developing the same.

3. The method according to claim 2, wherein the metal oxide nanoparticle is selected from the group consisting of titanium (Ti) alkoxides, zinc (Zn) alkoxides, tin (Sn) alkoxides, niobium (Nb) alkoxides, tungsten (W) alkoxides, strontium (Sr) alkoxides and zirconium (Zr) alkoxides.

4. The method according to claim 2, wherein the reaction regulator is acetic acid or acetylacetone capable of substituting an alkoxide group of the metal oxide precursor.

5. The method according to claim 2, wherein the molar ratio of the reaction regulator to the metal oxide precursor is in the range from 1:0.5 to 1:1.5.

6. The method according to claim 2, wherein the catalyst is selected from the group consisting of hydrochloric acid, sulfuric acid, nitric acid, sodium hydroxide, potassium hydroxide, and ammonia.

7. The method according to claim 6, wherein the catalyst is added in a concentration ranging from 0.01 to 0.5 N.

8. The method according to claim 2, wherein the mass ratio of the catalyst to the reaction regulator is in the range from 1:0.1 to 1:1.

9. The method according to claim 2, wherein the photocurable transparent polymer is selected from the group consisting of unsaturated polyester polymers, acrylic polymers, epoxy polymers, and polyvinylalcohol polymers.

10. The method according to claim 2, wherein the mass ratio of the metal oxide precursor to the photocurable transparent polymer is in the range from 1:0.01 to 1:0.5.

11. The method according to claim 2, wherein the sol-gel reaction is carried out at a temperature ranging from 80 to 150° C. for 1 to 300 minutes.

12. The method according to claim 2, wherein the photocuring reaction is carried out at a wavelength ranging from 200 to 400 nm and a dose ranging from 100 to 400 mJ.

13. The method according to claim 2, wherein the photocurable transparent inorganic/polymer composite layer has a thickness ranging from 400 to nm, a density ranging from 0.9 to 3.0 g/cm, a dielectric constant ranging from 4 to 15, and an average particle size ranging from 5 to 20 nm.

14. The method of claim 1, wherein the substrate and gate electrode layer are in the form of a transparent glass substrate or a transparent flexible polymer substrate deposited with a metal electrode.

15. The method of claim 14, wherein the transparent flexible polymer substrate is selected from the group consisting of polyethylene terephthalate (PET), polymethyl methacrylate (PMMA), polycarbonate (PC), and polyethylene sulfone (PES).

16. The method of claim 14, wherein the metal electrode is made of a metal selected from the group consisting of gold (Au), silver (Ag), chrome (Cr), cobalt (Co), copper (Cu), nickel (Ni), zinc (Zn), molybdenum (Mo), aluminum (Al), titanium (Ti), any mixtures thereof, and any alloys thereof.

17. The method of claim 1, wherein the substrate and gate electrode layer is in the form of a transparent glass substrate or a transparent flexible polymer substrate coated with a conductive thin film.

18. The method of claim 17, wherein the transparent flexible polymer substrate is selected from the group consisting of polyethylene terephthalate (PET), polymethyl methacrylate (PMMA), polycarbonate (PC), and polyethylene sulfone (PES).

19. The method of claim 17, wherein the conductive thin film is a thin film coated with ITO (Indium Tin Oxide), IZO (Indium Zinc Oxide), IZTO (Indium Zinc Tin oxide), FTO (F-doped $SnO_2$), ITO/ATO (Antimony Tin Oxide), or ITO/FTO.

20. The method of claim 1, wherein the organic activation layer is made of a low molecular organic semi-conductive material or a polymer semi-conductive material.

21. The method of claim 20, wherein the semi-conductive material is selected from the group consisting of pentacene, oligothiophene, regioregular poly(3-alkylthiophene), and poly(3-hexylthiophene).

* * * * *